(12) United States Patent
Schmitt (10) Patent No.: US 10,275,080 B2
(45) Date of Patent: Apr. 30, 2019

(54) METHOD AND APPARATUS FOR CONSTANT RESPONSE FROM SHAPE MEMORY ALLOY

(71) Applicant: Synaptics Incorporated, San Jose, CA (US)

(72) Inventor: Felix Schmitt, San Francisco, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/654,874

(22) Filed: Jul. 20, 2017

(65) Prior Publication Data

US 2019/0025973 A1 Jan. 24, 2019

(51) Int. Cl.
| | |
|---|---|
| G06F 3/041 | (2006.01) |
| G06F 3/01 | (2006.01) |
| G06F 3/044 | (2006.01) |
| G01R 31/28 | (2006.01) |
| G06F 3/03 | (2006.01) |

(52) U.S. Cl.
CPC ....... *G06F 3/0416* (2013.01); *G01R 31/2829* (2013.01); *G06F 3/016* (2013.01); *G06F 3/03* (2013.01); *G06F 3/044* (2013.01); *G06F 3/0412* (2013.01)

(58) Field of Classification Search
CPC .......... G06F 3/0416; G06F 3/016; G06F 3/03; G06F 3/0412; G06F 3/044; G01R 31/2829
See application file for complete search history.

(56) References Cited

U.S. PATENT DOCUMENTS

| | | | | |
|---|---|---|---|---|
| 2004/0115067 | A1* | 6/2004 | Rush | A61M 5/14216 417/322 |
| 2009/0115733 | A1* | 5/2009 | Ma | G06F 3/016 345/173 |
| 2010/0128002 | A1* | 5/2010 | Stacy | G06F 3/016 345/174 |
| 2011/0128236 | A1* | 6/2011 | Faubert | G06F 3/016 345/173 |
| 2017/0090574 | A1* | 3/2017 | Baer | G06F 1/1613 |
| 2017/0300166 | A1* | 10/2017 | Rosenberg | G06F 3/045 |

* cited by examiner

*Primary Examiner* — Stephen G Sherman
(74) *Attorney, Agent, or Firm* — Ferguson Braswell Fraser Kubasta PC (57) ABSTRACT

A method and apparatus for applying a current to a shape memory alloy of an actuator; determining a first resistance of the shape memory alloy; determining, after measuring the first resistance, a second resistance of the shape memory alloy; performing a comparison between the first resistance and the second resistance to detect a resistance change; and ceasing, based on detection of the resistance change, application of the current to the shape memory alloy.

18 Claims, 7 Drawing Sheets

METHOD AND APPARATUS FOR CONSTANT RESPONSE FROM SHAPE MEMORY ALLOY

FIELD

This invention generally relates to electronic devices.

BACKGROUND

Input devices, including proximity sensor devices (also commonly called touchpads or touch sensor devices), are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

In general, in one aspect, embodiments of the invention relate to a system that includes an actuator that includes a shape memory alloy. The system may also include actuator drive circuitry coupled to the shape memory alloy and configured to apply a current to the shape memory alloy. Additionally, the system may include measurement circuitry coupled to the shape memory alloy and configured to provide a first output to a processing system, and provide, after providing the first output, a second output to the processing system. The processing system may be coupled to the actuator drive circuitry and the measurement circuitry, and may be configured to determine a first resistance of the shape memory alloy using the first output; determine, after determining the first resistance, a second resistance of the shape memory alloy using the second output; perform a comparison between the first resistance and the second resistance to detect a resistance change; and cause the actuator drive circuitry to cease application of the current based on the comparison.

In general, in one aspect, embodiments of the invention relate to a method that includes applying a current to a shape memory alloy of an actuator; determining a first resistance of the shape memory alloy; determining, after measuring the first resistance, a second resistance of the shape memory alloy; performing a comparison between the first resistance and the second resistance to detect a resistance change; and ceasing, based on detection of the resistance change, application of the current to the shape memory alloy.

Other aspects of the invention will be apparent from the following description and the appended claims.

BRIEF DESCRIPTION OF DRAWINGS

The preferred exemplary embodiment of the present invention will hereinafter be described in conjunction with the appended drawings, where like designations denote like elements, and.

DETAILED DESCRIPTION

The following detailed description is merely exemplary in nature, and is not intended to limit the invention or the application and uses of the invention. Furthermore, there is no intention to be bound by any expressed or implied theory presented in the preceding technical field, background, brief summary or the following detailed description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide input devices and methods that facilitate improved usability. In particular, one or more embodiments of the invention are directed to providing actuation via an actuator (e.g., a haptic actuator). In various embodiments, actuation is caused by the application of current to shape memory alloy. Specifically, in one or more embodiments, the application of current to a shape memory alloy causes the temperature of the shape memory alloy to rise, leading to a contraction of the shape memory alloy. The rise in temperature and corresponding contraction of the shape memory alloy may cause actuation (e.g., haptic actuation) via a reversible phase transition occurring within the shape memory alloy that changes the structure (e.g., crystal lattice structure) of the shape memory alloy.

Figure 1:
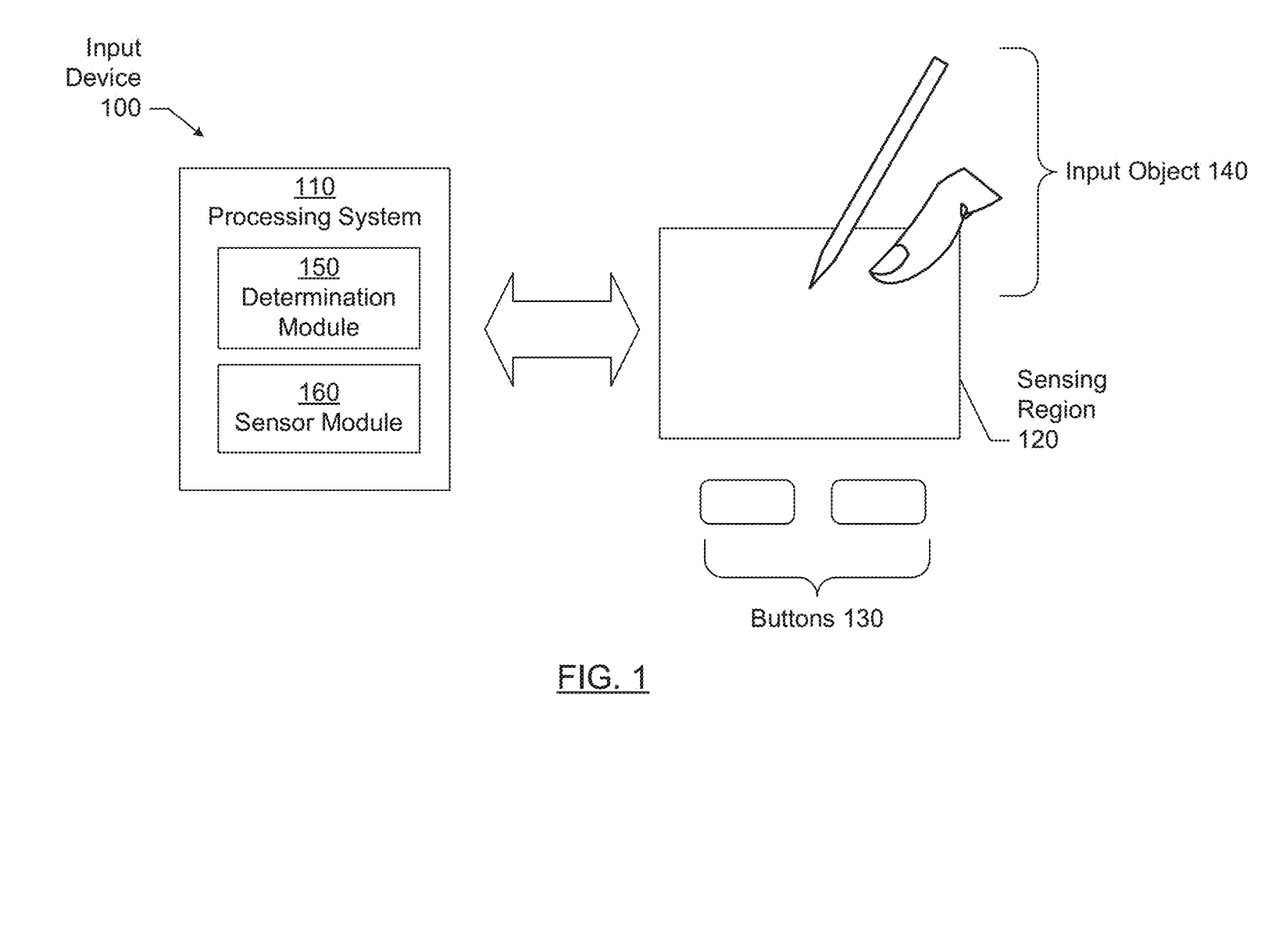
FIG. 1 shows a block diagram of an example system that includes an input device in accordance with an embodiment of the invention.

In one or more embodiments, the amount of time that current must be applied to the shape memory alloy to cause a phase transition varies based on at least the temperature of the shape memory alloy, which may be affected by the ambient temperature and by previous applications of current. In various embodiments, the shape memory alloy has an electrical resistance that varies with temperature, and undergoes a change when a phase transition occurs. For example, the resistance of a shape memory alloy may increase as temperature increases, and then drop by a measurable amount as the phase transition occurs. The shape memory alloy may be included in and/or coupled to a haptic actuator. For example, the shape memory alloy may be disposed between a base and a slider of a haptic actuator Turning now to the figures, FIG. 1 is a block diagram of an exemplary input device (100), in accordance with embodiments of the invention. The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) may be implemented as a physical part of the electronic system, or may be physically separate from the electronic system. Further, portions of the input device (100) may be part of the electronic system. For example, all or part of the determination module may be implemented in the device driver of the electronic system. As appropriate, the input device (100) may communicate with parts of the electronic system using any one or more of the following: buses, networks, and other wired or wireless interconnections. Examples include inter-integrated circuit (I²C), serial peripheral interface (SPI) bus, personal system 2 (PS/2), Universal Serial Bus (USB), Bluetooth, radio frequency (RF) connector, and infrared data association (IRDA) connector.

In FIG. 1, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1. Throughout the specification, the singular form of input object may be used. Although the singular form is used, multiple input objects may exist in the sensing region (120). Further, which particular input objects are in the sensing region may change over the course of one or more gestures. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment.

In some embodiments, the sensing region (120) extends from a surface of the input device (100) in one or more directions into space until signal-to-noise ratios prevent sufficiently accurate object detection. The extension above the surface of the input device may be referred to as the above surface sensing region. The distance to which this sensing region (120) extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device (100), contact with an input surface (e.g. a touch surface) of the input device (100), contact with an input surface of the input device (100) coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) includes one or more sensing elements for detecting user input. As several non-limiting examples, the input device (100) may use capacitive, elastive, resistive, inductive, magnetic, acoustic, ultrasonic, force, and/or optical techniques.

Some implementations are configured to provide images that span one, two, three, or higher-dimensional spaces. Some implementations are configured to provide projections of input along particular axes or planes. Further, some implementations may be configured to provide a combination of one or more images and one or more projections.

In some resistive implementations of the input device (100), a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may be a substantially constant voltage or a varying voltage. In various embodiments the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and, in various embodiments, the reference voltage may be system ground. In some embodiments, transmitter and sensor electrodes may both be modulated. The transmitter electrodes are modulated relative to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system (110) is shown as part of the input device (100). The processing system (110) is configured to operate the hardware of the input device (100) to detect input in the sensing region (120). The processing system (110) includes parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like.

In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, receiving and processing measurements related to the input device (e.g., resistances, voltages, currents, etc.) etc.

The processing system (110) may be implemented as a set of modules that handle different functions of the processing system (110). Each module may include circuitry that is a part of the processing system (110), firmware, software, and/or a combination thereof. In various embodiments, modules may be standalone modules, or may be implemented as various combinations of modules. Any one or more modules may be linked to any one or more other modules, with such links allowing the modules to function together to form a system. As a non-limiting example, a module or set of modules (e.g., processing system (110)), as used herein, may include software written in any programming language, which may be stored on volatile and/or non-volatile memory. Such software, when executed, may lead, directly (e.g., via compilation) or indirectly (e.g., via interpretation), to the generation of machine code (e.g., binary numbers such as 11010101) used as input to at least a portion of the integrated circuitry of one or more processors. Input of machine code to the processor(s) may cause various effects within the circuitry of the processor(s), with such effects implementing the at least a portion of the programming language source code from which the machine code was derived. Examples of such effects include, but are not limited to: biasing a transistor to allow current flow or not: creating connections between various portions of the circuitry; causing current to flow through various portions of circuitry; causing the voltage across a circuit element to change; etc. Said another way, as used herein, a module configured to perform certain functionality should be understood to include software and/or firmware, as well as at least a portion of the underlying computing hardware on which the software executes.

For example, as shown in FIG. 1, the processing system (110) may include a determination module (150) and a sensor module (160). The determination module (150) may include functionality to determine when at least one input object is in a sensing region, determine signal to noise ratio, determine positional information of an input object, identify a gesture, determine an action to perform based on the gesture, a combination of gestures or other information, and/or perform other operations.

The sensor module (160) may include functionality to drive the sensing elements to transmit transmitter signals and receive the resulting signals. For example, the sensor module (160) may include sensory circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals.

Although FIG. 1 shows only a determination module (150) and a sensor module (160), alternative or additional modules may exist in accordance with one or more embodiments of the invention. Such alternative or additional modules may correspond to distinct modules, or to sub-modules of one or more of the modules discussed above. Example alternative or additional modules include hardware operation modules for operating hardware such as sensor electrodes, haptic actuator components, and display screens; data processing modules for processing data such as sensor signals and positional information; reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, haptic actuation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes or other modules. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) is implemented with additional input components that are operated by the processing system (110) or by some other processing system. These additional input components may provide redundant functionality for input in the sensing region (120), or some other functionality. FIG. 1 shows buttons (130) near the sensing region (120) that may be used to facilitate selection of items using the input device (100). Other types of additional input components include sliders, balls, wheels, switches, and the like. Conversely, in some embodiments, the input device (100) may be implemented with no other input components.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

It should be understood that while many embodiments of the invention are described in the context of a fully-functioning apparatus, the mechanisms of the present invention are capable of being distributed as a program product (e.g., software) in a variety of forms. For example, the mechanisms of the present invention may be implemented and distributed as a software program on information-bearing media that are readable by electronic processors (e.g., non-transitory computer-readable and/or recordable/writable information bearing media that is readable by the processing system (110)). Additionally, the embodiments of the present invention apply equally regardless of the particular type of medium used to carry out the distribution. For example, software instructions in the form of computer readable program code to perform embodiments of the invention may be stored, in whole or in part, temporarily or permanently, on a non-transitory computer-readable storage medium. Examples of non-transitory, electronically-readable media include various discs, physical memory, memory, memory sticks, memory cards, memory modules, and or any other computer readable storage medium. Electronically-readable media may be based on flash, optical, magnetic, holographic, or any other storage technology.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores or micro-cores of a processor. Further, one or more elements of one or more embodiments may be located at a remote location and connected to the other elements over a network. Further, embodiments of the invention may be implemented on a distributed system having several nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While FIG. 1 shows a configuration of components, other configurations may be used without departing from the scope of the invention. For example, various components may be combined to create a single component. As another example, the functionality performed by a single component may be performed by two or more components. Accordingly, the invention should not be limited to the configuration of components shown in FIG. 1.

Figure 2:
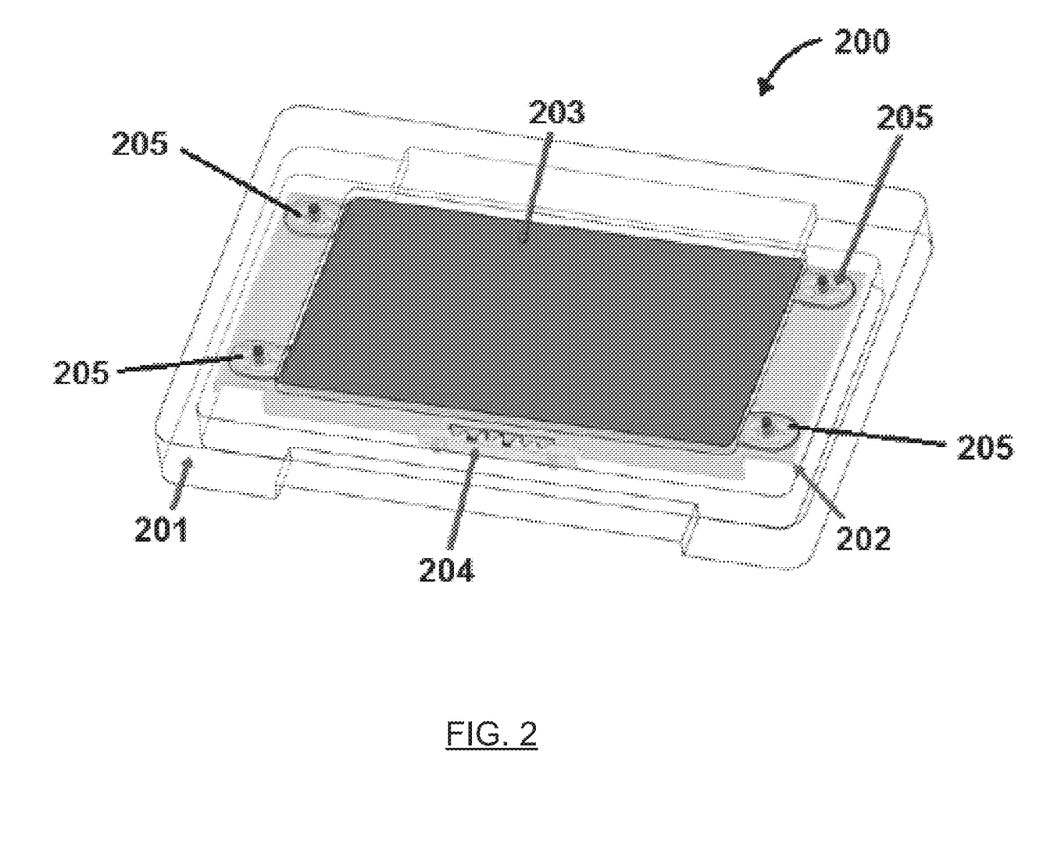
FIG. 2 shows a perspective view of an example input device in accordance with an embodiment of the invention.

FIG. 2 shows a perspective view of an example input device (200) in accordance with one or more embodiments. In one or more embodiments, the input device (200) is configured to determine positional and/or force information from one or more input objects in a sensing region. In the exemplary embodiment of an input device shown in FIG. 2, the input device (200) includes a housing (201), a rigid support substrate (202), and an input surface (203). In one or more embodiments, the input surface (203) may be a sensing region. In one or more embodiments, the sensing region may be proximate to one or more sensing electrodes for determining positional information. Additionally or alternatively, the sensing region may be coupled to a force sensor, and the force sensor may be used to determine positional information and/or force information for one or more input objects on the input surface (203). In one or more embodiments, the force sensor includes one or more sensor electrodes and determines force applied by the input objects (e.g., the input objects (140) shown in FIG. 1) on the input surface (203). In one or more embodiments, a sensed force greater than a force threshold, or any other type of user input, triggers a haptic actuation.

In one or more embodiments, the input surface (203) may be disposed above the rigid support substrate (202), and the rigid support substrate (202) may be mechanically coupled to the housing (201) and may include one or more openings. Further, in one or more embodiments, one or more coupling elements (205) may be disposed through the openings of the rigid support substrate (202) and may be disposed between the housing (201) and the rigid support substrate (202). In other words, in one or more embodiments, the coupling elements (205) may be used to mechanically couple the rigid support substrate (202) to the housing (201). In one or more embodiments, each of the coupling elements (205) may be configured to allow the rigid support substrate (202) to displace in an activation direction relative to the housing (201). The activation direction may be any direction relative to the housing. As an example, the activation direction may be on a plane of the input surface (203). As another example, the activation direction may be perpendicular to the plane of the input surface (203).

Further, in one or more embodiments, the input device (200) includes a haptic actuator (204). In one or more embodiments, the haptic actuator (204) may actuate in response to a position and/or force of an input object. Additionally, in one or more embodiments, the haptic actuator may cause actuation for any reason relevant to the conveyance of information to a user of the input device. In one or more embodiments, the haptic actuator (204) may be coupled to the rigid support substrate (202), and actuation of the haptic actuator (204) may result in a force being applied to the rigid support substrate (202) by the haptic actuator (204), (e.g., in the direction of actuation). The coupling elements (205) may be used to allow displacement of the rigid support substrate (202) in an activation direction relative to the housing (201), for example, as a result of actuation via the haptic actuator (204). As shown, in one or more embodiments, the coupling elements (205) may be positioned near corner portions and/or edge portions of the rigid support substrate (202), and openings may be formed in such portions of the rigid support substrate (202), accordingly.

In one or more embodiments, the electronic system also includes a processing system (e.g., the processing system (110) of FIG. 1) configured to determine positional information and/or force information for one or more input objects (e.g., the input objects (140) of FIG. 1) and to actuate the haptic actuator (204) to translate the rigid support substrate (202) in the activation direction. Additionally, in one or more embodiments, the processing system may include functionality to receive measurements related to a shape memory alloy of the haptic actuator (204). For example, the processing system may include functionality to receive a voltage output from measurement circuitry once such voltage has been scaled and amplified by measurement circuitry coupled to both the processing system and the shape memory alloy of the haptic actuator. The voltage output may be a ratiometric value expressing the ratio between an input voltage to a shape memory alloy and an output voltage from a voltage divider that includes the shape memory alloy.

In such an example, the processing system includes functionality to use the scaled and amplified voltage to determine the resistance of the shape memory alloy. Based on the calculated resistance of the shape memory alloy, the processing system may include functionality to cause haptic drive circuitry to which the processing system is coupled to cease application of current to the shape memory alloy of the haptic actuator (204).

While FIG. 2 shows a configuration of components, other configurations may be used without departing from the scope of the invention. For example, various components may be combined to create a single component. As another example, the functionality performed by a single component may be performed by two or more components. Additionally, in one or more embodiments, the haptic actuator (204) may be disposed in any location relative to a component (e.g., the rigid support substrate (202)) that may be translated via actuation via the haptic actuator (204). Furthermore, although input device (200) and haptic actuator (204) are described, one having ordinary skill in the art, and the benefit of this Detailed Description, will understand that actuation via a shape memory alloy, as described herein, may apply to any actuator for any purpose, and is not limited to haptic actuation as related to an input device. Accordingly, for at least the above-recited reasons, embodiments of the invention should not be considered limited to the specific arrangements of components and/or elements shown in FIG. 2.

Figure 3:
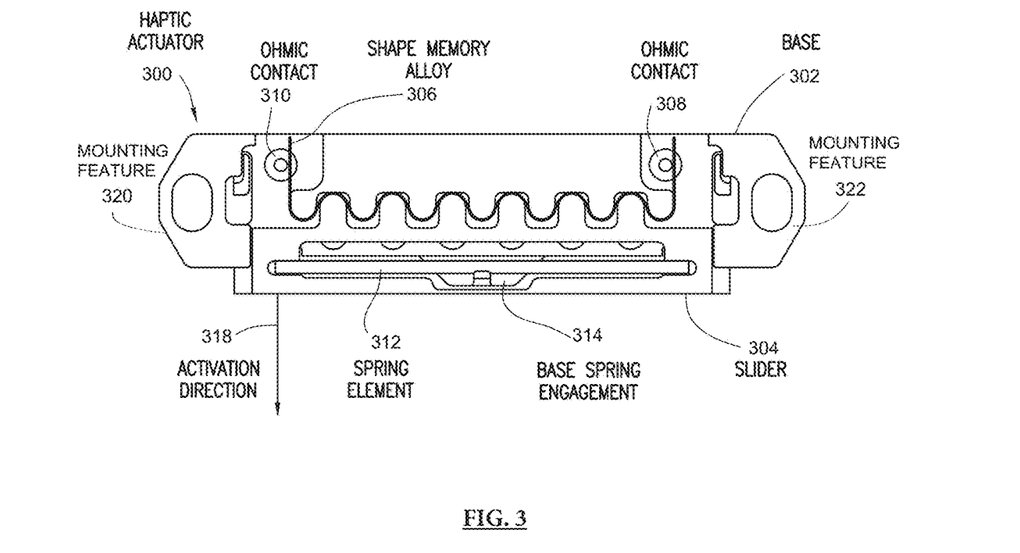
FIG. 3 shows a plan view of an example haptic actuator before actuation in accordance an embodiment of the invention.

FIG. 3 shows an example haptic actuator in accordance with one or more embodiments. The following example is for explanatory purposes only and not intended to limit the scope of the invention, as various embodiments may include a haptic actuator other than the example haptic actuator shown in FIG. 3.

FIG. 3 shows a plan view of an exemplary haptic actuator in accordance with one or more embodiments. As shown in FIG. 3, the haptic actuator (300) includes a base (302), a slider (304), a shape memory alloy (306), two ohmic contacts (308 and 310), a spring element (312), and a base spring engagement (314). Additionally, the example haptic actuator (300) of FIG. 3 is configured to move the slider (304) in activation direction (318). Each of these components is described below.

In one or more embodiments of the invention, haptic actuator (300) is substantially similar to haptic actuator (204) discussed above in the description of FIG. 2. In one or more embodiments, haptic actuator (300) includes a base (302). In one or more embodiments, the base (302) may be formed from any rigid material (e.g., a metal such as aluminum). Additionally, the base (302) may be coated (e.g., anodized to create a thin layer of non-conductive aluminum oxide) such that the base (302) is not electrically conductive, but is thermally conductive. For example, a base made from aluminum may be thermally conductive, but may have a surface that is not electrically conductive once the aluminum base is anodized. In one or more embodiments, the thermal conductivity of the base (302) provides for heat dissipation from the haptic actuator (300). For example, the thermal conductivity of the base may provide for heat dissipation from the shape memory alloy (306).

In the embodiment shown in FIG. 3, the base (302) has a length that is longer than the width, and a thickness that is less than either the length or width. In such embodiments, the relatively small thickness contributes to a haptic actuator (300) having a low profile. For example, the total thickness may be between two millimeters and three millimeters. One having ordinary skill in the art and the benefit of this Detailed Description will appreciate that the shape, length, and/or width of the haptic actuator (300) may vary from embodiments such as the example haptic actuator shown in FIG. 3 without departing from the scope of the invention.

In one or more embodiments, the base (302) includes one or more mounting features (e.g., 320 and 322). The one or more mounting features (320 and 322) may be any shape and/or any location in or on the base (302) that allows the haptic actuator (300) to be mounted on to or assembled as part of a device (e.g., input device (200) of FIG. 2) or any other component. In the example embodiment shown in FIG. 3, one mounting feature (320 and 322) is located at each end of the length of the base (302) and each mounting feature has a generally oval shape that extends through the base (302). The mounting features (320 and 322) may be used, for example, by inserting screws (not shown) or other attaching elements (not shown) through the mounting features (320 and 322) to affix the haptic actuator (300) to a device.

In one or more embodiments, the base (302) may include one or more holes (not shown) for mounting one or more ohmic contacts (308 and 310). An ohmic contact (308 and 310) may be any contact surface that is electrically conductive (i.e., through which current may pass at least some of the time). As an example, the ohmic contacts (308 and 310) may be constructed, at least in part, of a metal such as copper. In one or more embodiments, the ohmic contacts (308 and 310) are affixed (e.g., glued) to the base such that the ohmic contacts (308 and 310) pose less risk of accidentally scratching the base (302), which may affect the electrical isolation of the base (302). In one or more embodiments, the ohmic contacts (308 and 310) are disposed within cavities (not shown) of the base (302), which may or may not extend through the entire base. Disposition within the cavities may allow the ohmic contacts (308 and 310) to be affixed to the base (302), and to a shape memory alloy (306).

In one or more embodiments, the haptic actuator (300) includes a slider (304). Similar to the base (302), in one or more embodiments, the slider (304) may be formed from any rigid material (e.g., a metal such as aluminum). Additionally, the slider (304) may be coated (e.g., anodized) such that the slider (304) is not electrically conductive, but is thermally conductive. For example, a slider made from aluminum may be thermally conductive, but may have a surface that is not electrically conductive once the aluminum slider is anodized. In one or more embodiments, the thermal conductivity of the slider (304) provides for additional heat dissipation from the haptic actuator (300). For example, the thermal conductivity of the slider may provide for additional heat dissipation from the shape memory alloy (306). In one or more embodiments, the slider (304) is constructed from the same material as the base (302). In other embodiments, the slider (304) is constructed from a different material than the base (302).

In one or more embodiments, the slider (304) is disposed as at least a partial sheath that covers at least a portion of the base (302). For the sake of clarity, as shown in FIG. 3, the shape memory alloy (306) is visible. However, in various embodiments, the slider is a partial sheath that covers at least the shape memory alloy (306). Such a coupling may allow the base (302) and the slider (304) to have engagement surfaces in which a shape memory alloy (306) may be disposed. Disposition of the shape memory alloy (306) between an engagement surface of the base (302) and an engagement surface of the slider (304) may reduce the chance of unwanted translation of the shape memory alloy (306) relative to the haptic actuator (300). For example, in embodiments that have the shape memory alloy (306) within the sheath of the slider (304), the shape memory alloy is less likely to translate away from the haptic actuator (300).

The base (302) and slider (304) of the haptic actuator (300) may be coupled such that the base and the slider are interlocked, but allow for translation of the slider (304) relative to the base (302) in at least one direction. For example, FIG. 3 shows an embodiment in which the base (302) and the slider (304) are interlocked such that the slider may translate relative to the base in the activation direction (318).

In one or more embodiments, the shape memory alloy (306) may be any electrically conductive material that undergoes a reversible phase transition when subject to a change in temperature. For example, a shape memory alloy (306) may increase in temperature (i.e., is heated) when current is applied, and contract when the temperature increases past a phase transition temperature of the material. In one or more embodiments, the contraction is due to a change in the crystal lattice structure of the shape memory alloy as it undergoes the phase transition. In one or more embodiments of the invention, when the shape memory alloy (306) cools, it returns to its uncontracted state (e.g., the crystal lattice structure returns to its previous state). The heating and cooling of the shape memory alloy (306) may provide for actuation of the haptic actuator (300). As is discussed below, the actuation may be aided by a spring (e.g., spring element 312). In one or more embodiments, changing the temperature of the shape memory alloy via application of current also causes a change in the resistance of the shape memory alloy. In embodiments such as that shown in FIG. 3, the shape memory alloy (306) may be formed in a wire or ribbon shape and disposed over base (302) protrusions and within a sheath created by the slider (304). Examples of alloys from which the shape memory alloy (306) may be formed include, but are not limited to, a nickel-titanium alloy and a copper-aluminum-nickel alloy.

In one or more embodiments, the spring element (312) is any object of any material that is capable of storing mechanical energy which, when the spring element (312) is deflected from a resting position, exerts a force in an attempt to return to the resting state. In one or more embodiments, the force a spring element (312) may apply may be proportional to the amount of deflection the spring element undergoes. In various embodiments, such as the embodiment shown in FIG. 3, the spring element (312) is coupled to the slider (304), with distal ends of the spring element secured within portions of the slider, and the remainder of the spring element disposed within an opening in the slider (304). In the example haptic actuator (300) shown in FIG. 3, the spring element (312) is in a resting position. Application of current to the shape memory alloy (306) via one or more of the ohmic contacts (308, 310) may cause the shape memory alloy (306) to contract, moving the slider (304) in the activation direction (318) relative to the base (302). Such movement may cause a deflection of the spring element (312) from a resting position, with the spring element (312) storing mechanical energy for exerting a force in the opposite direction from the activation direction (318). The force in the opposite direction exerted by the spring element (312) may return the slider (304) to a pre-actuation position once current is no longer applied to the shape memory alloy (306) and the shape memory alloy undergoes a reverse of the phase change previously undergone.

In one or more embodiments, the base (302) includes a base spring engagement (314). In one or more embodiments, the base spring engagement (314) is formed as a part of the base (302) and extends from the base in the same direction as the activation direction (318). In one or more embodiments, the base spring engagement (314) is any extension of the base that may be coupled to the spring element (312). In various embodiments, such as the embodiment shown in FIG. 3, the base spring engagement (314) extends from the base (302) in an opening of the slider (304) and couples with a central portion of the spring element (312). In one or more embodiments, the spring element (312) is in a resting position when the slider (304) and the base (302) are engaged as shown in FIG. 3. In one or more embodiments, the spring element (312) provides a bias force to hold the base (302) and slider (304) together in an assembled configuration (as shown) and/or provide a return force after actuation of the haptic actuator (300).

While FIG. 3 shows an example configuration of components of a haptic actuator, other configurations may be used without departing from the scope of the invention. For example, various components may be combined to create a single component. As another example, the functionality performed by a single component may be performed by two or more components. Additionally, in one or more embodiments, the haptic actuator (300) may include components and/or elements disposed in different locations relative to one another than are shown in FIG. 3. For example, the slider and the base may be interlocked in a manner that allows for movement in a direction other than the activation direction shown in FIG. 3. As another example, the ohmic contacts may be located at a different location on the base, or on the slider. As another example, in one or more embodiments, the base (302) may be formed as an integral part of the rigid support substrate (202). For example, the rigid support substrate (202) may be machined and/or formed to include the features of the base (302) of the haptic actuator. In such embodiments, the cost of manufacturing and/or assembly of the input device (200) may be reduced. Accordingly, for at least the above-recited reasons, embodiments of the invention should not be considered limited to the specific arrangements of components and/or elements shown in FIG. 3.

Figure 4:
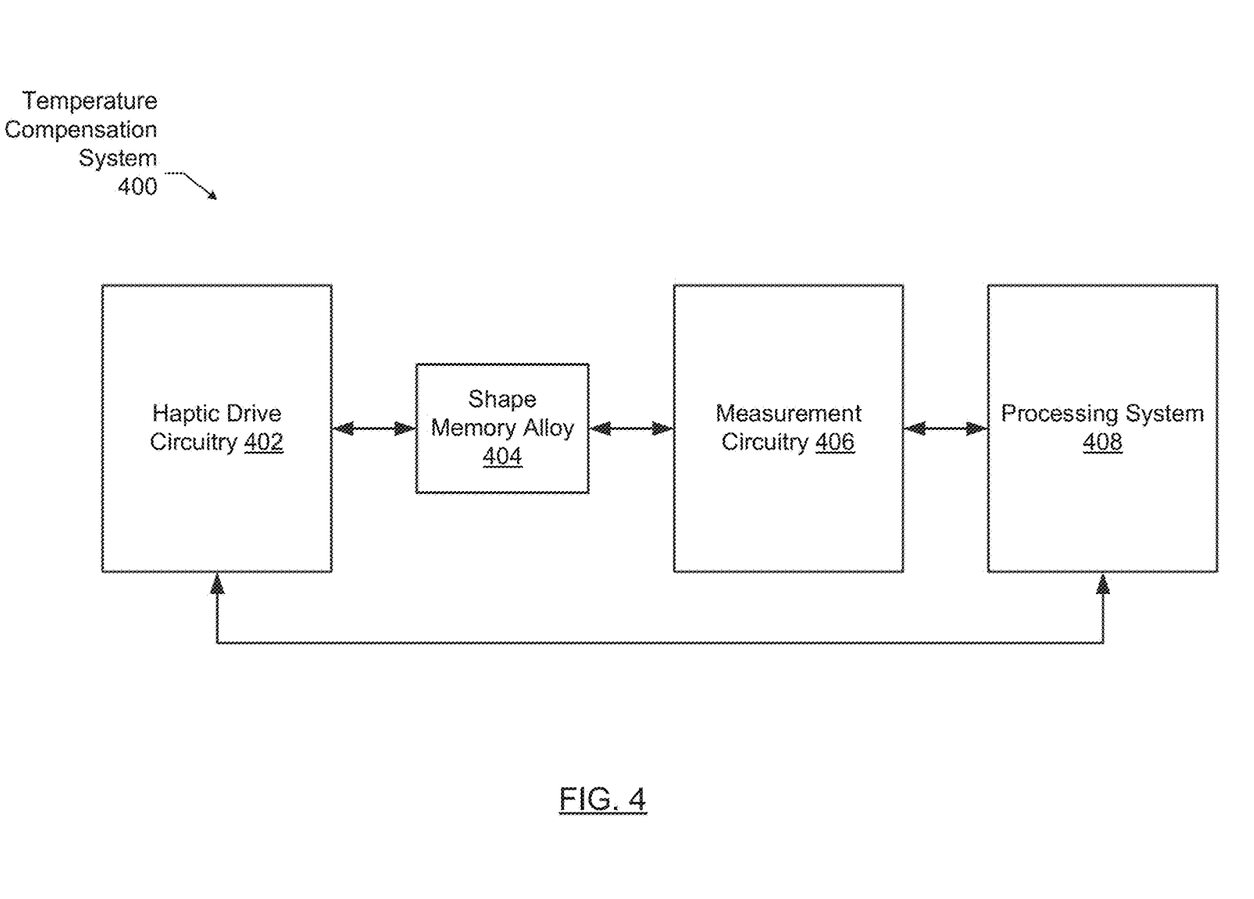
FIG. 4 shows a block diagram of an example temperature compensation system in accordance with an embodiment of the invention.

Turning to FIG. 4, FIG. 4 shows a temperature compensation system for a shape memory alloy-based haptic actuator in accordance with one or more embodiments. As shown in FIG. 4, the temperature compensation system includes haptic drive circuitry (402), a shape memory alloy (404), measurement circuitry (406), and a processing system (408). Each of these components is described below.

In one or more embodiments, the shape memory alloy (404) is substantially similar to the shape memory alloy (306) discussed above in the description of FIG. 3. As such, though not shown in FIG. 4 for the sake of clarity, the shape memory alloy may be a part of a haptic actuator and may cause actuation via contraction of the material as it undergoes a reversible phase change. The shape memory alloy (404) may be coupled to haptic drive circuitry (402), which may provide a current to the shape memory alloy (404) (e.g., via ohmic contacts (308) and (310) of FIG. 3). The shape memory alloy (404) may also be coupled to measurement circuitry (406), which may include functionality to measure the voltage input to the shape memory alloy (404) and the output voltage of a voltage divider that includes the shape memory alloy. Such measurements may allow for a determination of the resistance across the shape memory alloy (404) (e.g., by the processing system (408)).

In one or more embodiments, the haptic drive circuitry (402) is any hardware (e.g., circuitry), and may include software, firmware, or any combination thereof that includes functionality to apply a current to a shape memory alloy (404), and of ceasing application of the current when so directed. The haptic drive circuitry (402) may include, but is not limited to, any number of the following circuit element types: wire, capacitors, resistors, and transistors. An example embodiment of haptic drive circuitry is discussed in the description of FIG. 7, below. In one or more embodiments, the haptic drive circuitry is coupled to a source of power (not shown). The haptic drive circuitry may include one or more elements, such as a capacitor, capable of storing charge received from the power source. In one or more embodiments, the haptic drive circuitry is coupled to the shape memory alloy (404), as discussed above, and to the processing system (408). In one or more embodiments, the haptic drive circuitry is implemented using analog circuitry.

In one or more embodiments, the measurement circuitry (406) is any hardware (e.g., circuitry), and may include software, firmware, or any combination thereof that includes functionality to measure the output voltage of a voltage divider that includes the shape memory alloy (404) and a sensing resistor, and the input voltage to the shape memory alloy. In one or more embodiments, the measurement circuitry also includes functionality to amplify and/or offset measured voltages, as necessary, and provide as an output a ratiometric value to the processing system (408) that represents the ratio of the input voltage to the shape memory alloy and the output voltage from a voltage divider. Such amplification and/or offsetting may be required to put voltages within an operating range of at least some portion of the processing system (408). For example, the processing system may include an analog-to-digital converter that requires an input within a certain range. In such an example, if the voltage output from the voltage divider is below such a range, the measurement circuitry includes functionality to amplify the voltage such that so that the output from the measurement circuitry to the processing system is within the usable range of the analog-to-digital converter. In one or more embodiments, the measurement circuitry is coupled to the shape memory alloy (404), as discussed above, and to the processing system (408). The measurement circuitry (406) may include, but is not limited to, any number of any the following circuit element types: wire, capacitors, resistors, and operational amplifiers. As mentioned above, the measurement circuitry (406) may include a sensing resistor (not shown) that is used, along with the shape memory alloy, to create a voltage divider. An example embodiment of measurement circuitry is discussed in the description of FIG. 7, below. In one or more embodiments, the measurement circuitry is implemented using analog circuitry.

In one or more embodiments, the processing system (408) is any hardware (e.g., circuitry), and may include software, firmware, or any combination thereof that includes functionality to receive an output from the measurement circuitry (406), and use the received output to determine the resistance across the shape memory alloy, which, as discussed above, varies with temperature and undergoes a measurable change when a phase transition occurs in the shape memory alloy (404). In one or more embodiments, the processing system (408) is all or a portion of processing system (110) discussed above in the description of FIG. 1. In one or more embodiments, the processing system is implemented, at least in part, using analog circuitry. The processing system (408) may also include functionality to cause the haptic drive circuitry (402) to cease application of current to the shape memory alloy (404) based on the calculated resistance of the shape memory alloy (404). For example, if the processing system determines that the resistance of the shape memory alloy experiences a drop greater than a pre-determined threshold (e.g., ten percent) after experiencing an increase, then the phase transition of the shape memory alloy has occurred and the processing system will cause the haptic drive circuitry to cease application of current to the shape memory alloy.

While FIG. 4 shows a configuration of components, other configurations may be used without departing from the scope of the invention. For example, various components may be combined to create a single component. As another example, the functionality performed by a single component may be performed by two or more components. In one or more embodiments of the invention, one or more of the circuitry, system, and elements shown in FIG. 4 may be omitted, repeated, and/or substituted. Accordingly, embodiments of the invention should not be considered limited to the specific arrangements of components and elements shown in FIG. 4.

Figure 5:
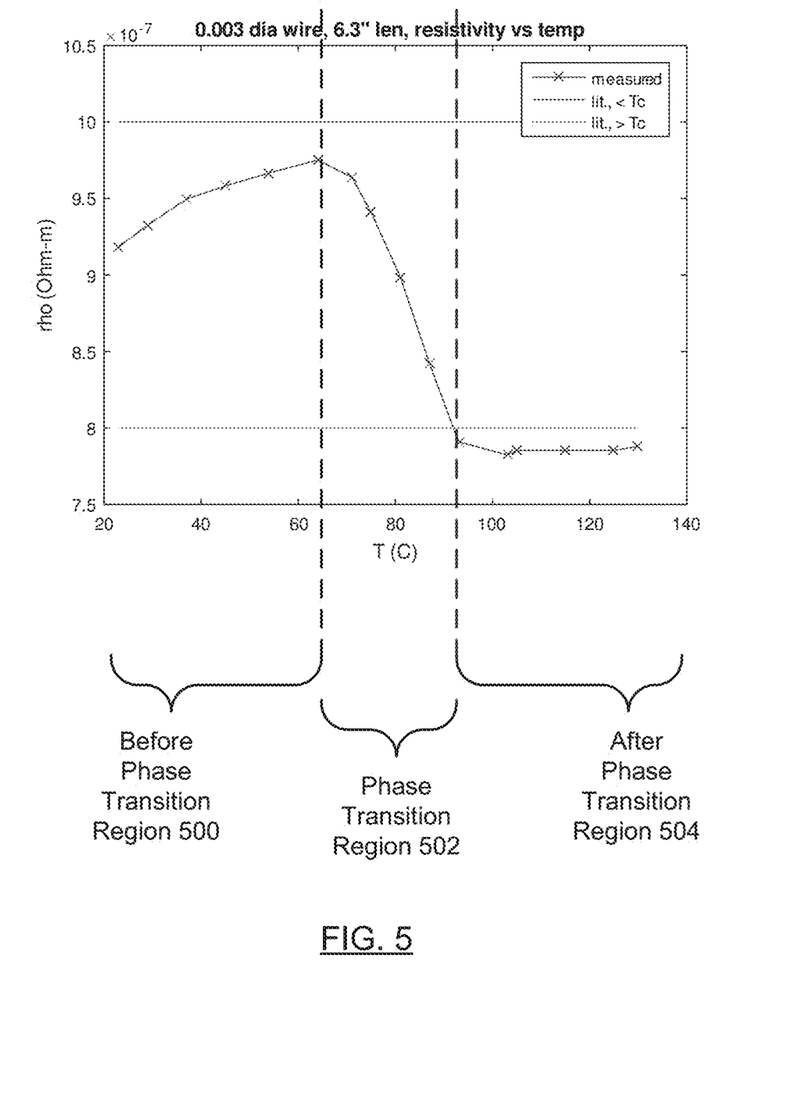
FIG. 5 shows an example graph of the relationship between temperature and resistance of a shape memory alloy in accordance with an embodiment of the invention.

FIG. 5 shows an example graph of the relationship between resistivity and temperature for a given shape memory alloy in accordance with one or more embodiments. The following example is for explanatory purposes only and not intended to limit the scope of the invention, as various embodiments may include a shape memory alloy with a temperature-resistance relationship other than the example shown in FIG. 5.

Turning to FIG. 5, consider a scenario in which an actuator is actuated by the contraction of a shape memory alloy that undergoes a reversible phase change. To cause an actuation in such a scenario, a current is applied to the shape memory alloy. The application of the current causes the temperature of the shape memory alloy to rise, which causes the resistivity of the shape memory alloy to increase. The increase occurs after application of the current but before the shape memory alloy undergoes a phase transition. The increasing resistivity is shown as the Before Phase Transition Region (500) of the resistivity vs. temperature graph of FIG. 5.

Once an initial phase transition temperature of the shape memory alloy is reached, the shape memory alloy undergoes the phase transition, causing the contraction that actuates an actuator. As a result of the phase transition, the resistivity of the shape memory alloy drops as the temperature continues to increase until the phase transition is complete. The drop in resistivity is shown in the Phase Transition Region (502) of FIG. 5. After the phase transition, the resistivity ceases dropping as temperature increases (and may begin to increase again), which is shown in the After Phase Transition Region (504) of FIG. 5.

One of ordinary skill in the art and having the benefit of this Detailed Description will appreciate that the temperature, and thus the resistance, of a shape memory alloy depends on a variety of factors. Such factors include, but are not limited to, ambient temperature and temperature changes resulting from one or more previous applications of current to the shape memory alloy. As such, the amount of time that current needs to be applied to a shape memory alloy to cause a phase transition differs based on the temperature when the application of current begins.

Figure 6:
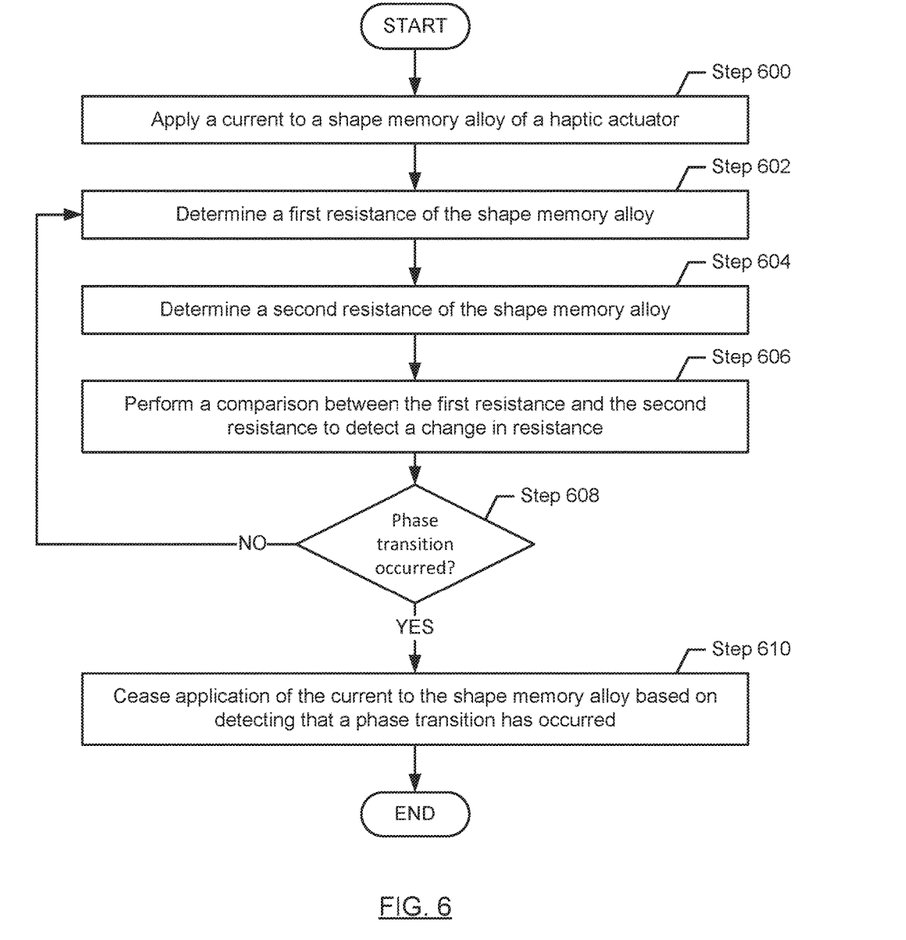
FIG. 6 shows a flowchart in accordance with an embodiment of the invention.

FIG. 6 shows a flowchart in accordance with one or more embodiments. While the various steps in the flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

FIG. 6 shows a flowchart describing a method for determining when to cease application of current to a shape memory alloy of a haptic actuator in accordance with one or more embodiments. While FIG. 6 is described in relation to a haptic actuator, one having ordinary skill in the art, and the benefit of this Detailed Description, will understand that the described method may apply to any actuator that is actuated via a shape memory alloy, with current applied to the shape memory alloy via any method of applying current to a material.

In Step 600, current is applied to a shape memory alloy of a haptic actuator. In one or more embodiments, current is applied using haptic drive circuitry. Current may be applied in order to actuate the haptic actuator, and thus provide haptic feedback to a user of an input device. The current may be applied for any reason, such as a software event, a force threshold being reached and/or exceeded by a force on an input device, a power on or power off event, as a response to a user input to an input device via an input object, etc.

In Step 602, a first resistance of the shape memory alloy is determined. In one or more embodiments, the resistance is determined by implementing a voltage divider using the shape memory alloy as one resistor, and a sensing resistor as a second resistor. Measurement circuitry may be coupled to the output voltage of the voltage divider and the input to the shape memory alloy. The measurement circuitry may then amplify and/or offset the output voltage of the voltage divider such that a ratiometric output (expressing the ratio between an input voltage to the shape memory alloy and the output voltage from the voltage divider) provided to a processing system is within an operating range of one or more components of a processing system, such as, for example, an analog-to-digital converter. Once the processing system receives the amplified and/or offset output from the measurement circuitry, the processing system may determine the resistance of the shape memory alloy. In one or more embodiments, in order to generate the ratiometric value output, the measurement circuitry also measures the voltage applied to the shape memory alloy as a result of the application of current by the haptic drive circuitry.

A relevant equation showing the relationship between input voltage (Vin), output voltage (Vout), and two resistive elements (R1 and R2) of a voltage divider is as follows:

$$Vout=Vin*[R2/(R1+R2)]$$

The first resistive element of the voltage divider, R1, is the shape memory alloy. The second resistive element of the voltage divider, R2, is the sensing resistor, which has a known value. Rearranging the above equation to solve for R1 yields:

$$R1=[Vin/Vout]*[R2/2]$$

In one or more embodiments, the measurement circuitry uses the input voltage to the shape memory alloy and the output voltage from the voltage divider to create a ratiometric value corresponding to the ratio between the input voltage to the shape memory alloy and the output voltage of the voltage divider. Once the ratiometric value has been received by the processing system, the ratiometric value and the resistance value of the sensing resistor (as R2 of the voltage divider) may be used to determine the resistance of the shape memory alloy (as R1 of the voltage divider). After the first resistance is calculated, it may be stored (e.g., in memory).

In Step 604, a second resistance of the shape memory alloy is determined. In one or more embodiments, the resistance of the shape memory alloy is being continuously or periodically calculated while current is being applied to the shape memory. The second resistance calculation is substantially similar to the calculations discussed above in the description of Step 602. After the second resistance is calculated, it may be stored (e.g., in memory).

In Step 606, a comparison is performed between the first resistance and the second resistance. In one or more embodiments, the comparison is performed by the processing system by accessing the first resistance value and the second resistance value to determine whether a phase transition, or a portion thereof, of the shape memory alloy has occurred. Such a determination may be made by comparing the resistance values to determine of the change in resistance is indicative of a phase change in the shape memory alloy.

In Step 608, based on the comparison of Step 606, the processing system determines whether a phase transition has occurred. For example, the processing system may note that the second resistance is higher than the second resistance, and thus determine that a phase transition has not occurred. If a phase transition has not occurred, then the process returns to Step 602 and continues to measure the resistance of the shape memory alloy. On the other hand, the processing system may determine that a phase transition has at least partially occurred. For example, after a period of time where application of current caused the resistance to increase, the processing system may determine that the resistance has decreased more than a pre-determined threshold. In one or more embodiments, such a decrease indicates that the shape memory alloy is undergoing or has completed a phase transition. If the processing system determines that the phase transition has occurred (causing a harder actuation), or has partially occurred (causing a softer actuation), then the process proceeds to Step 610.

In Step 610, based on a determination that the shape memory alloy has undergone at least a portion of a phase change, the processing system causes the haptic drive circuitry to cease application of current to the shape memory alloy. As an example, the processing system may cease an input to the haptic drive circuitry, which causes a transistor to cease allowing current flow to the shape memory alloy.

Figure 7:
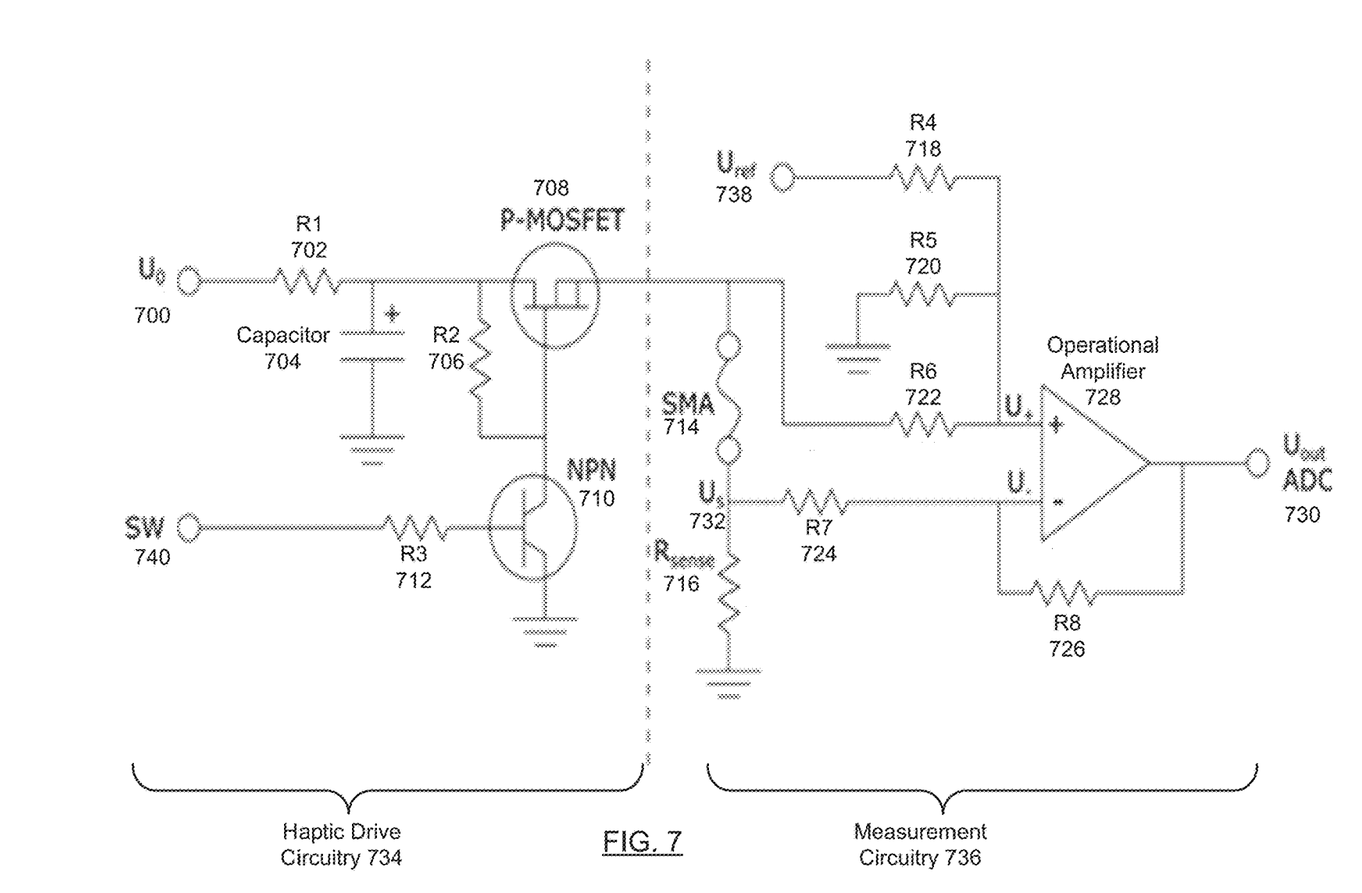
FIG. 7 shows a diagram of example haptic drive circuitry and measurement circuitry in accordance with an embodiment of the invention.

FIG. 7 shows example haptic drive circuitry and measurement circuitry in accordance with one or more embodiments. The following example is for explanatory purposes only and not intended to limit the scope of the invention, as various embodiments may include a circuitry that is different than the example circuitry shown in FIG. 7.

Turning to FIG. 7, consider a scenario in which a haptic actuator includes a shape memory alloy (714). In such a scenario, the shape memory alloy is coupled to both haptic drive circuitry (734) measurement circuitry (736).

In one or more embodiments, the haptic drive circuitry is coupled to a power source that provides a voltage $U_0$ (700) to the haptic drive circuitry (734). The voltage is used to send current through resistor R1 (702) and charge capacitor (704). The haptic drive circuitry also includes an SW input (740) coupled to a processing system (not shown). When current is to be provided to a shape memory alloy (714), the SW input (740) is set to high. When the SW input (740) is set to high by the processing system, then current flows through resistor R3 (712) to NPN transistor (710), causing the stored charge of capacitor (704) created by the application of $U_0$ (700) to the circuit to discharge and cause current to flow through P-MOSFET (708), shape memory alloy (714), and $R_{sense}$ (716). When the SW input (740) is set to low, current is prevented from flowing through P-MOSFET (708), shape memory alloy (714), and $R_{sense}$ (716).

In one or more embodiments, when current flows through P-MOSFET (708), the current reaches shape memory alloy (SMA) (714) and $R_{sense}$ (716). The SMA (714) and $R_{sense}$ (716) act as a voltage divider, with output voltage $U_S$ (732). $U_S$ (732) is thus the voltage provided to resistor R7 (724), causing a current to flow as input to the negative input of operational amplifier (728) and a feedback resistor R8 (726). A reference voltage $U_{ref}$ (738), resistor R4 (718), resistor R5

(720), and resistor R6 (722) are part of the measurement circuitry used in measuring the input voltage to the SMA (714) and the voltage output from the voltage divider of which the SMA is a part. Reference voltage $U_{ref}$ (738), resistor R4 (718), resistor R5 (720), resistor R6 (722), resistor R7 (724), and resistor R8 (726) may also be considered as a portion of the measurement circuitry for amplifying and/or offsetting the measured voltages such that the output $U_O$ of operational amplifier (728) is within an operating range of an analog-to-digital converter (ADC) (730) of a processing system (not shown).

In such a scenario, the output of operational amplifier (728) represents a ratiometric value that defines the ratio between the input voltage to the SMA (714) and the output voltage $U_S$ (732) of the voltage divider formed using the SMA (714) and $R_{sense}$ (716). The ratiometric value, along with the resistance value of $R_{sense}$ (716) may be used by the processing system (not shown) to calculate the resistance across SMA (714) at a given point in time.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
   an actuator comprising a shape memory alloy;
   actuator drive circuitry coupled to the shape memory alloy and configured to apply a current to the shape memory alloy;
   measurement circuitry coupled to the shape memory alloy and configured to:
      provide a first output to a processing system; and
      provide, after providing the first output, a second output to the processing system; and
   the processing system comprising circuitry coupled to the actuator drive circuitry and the measurement circuitry, and configured to:
      determine a first resistance of the shape memory alloy using the first output;
      determine, after determining the first resistance, a second resistance of the shape memory alloy using the second output;
      perform a comparison between the first resistance and the second resistance to detect a resistance change;
      based on the detected resistance change, detect that the shape memory alloy underwent at least a partial phase transition resulting in actuation of the actuator; and
      cause the actuator drive circuitry to cease application of the current based on the detected partial phase transition.

2. The system of claim 1, wherein:
   the measurement circuitry comprises a voltage divider comprising the shape memory alloy and a sensing resistor,
   the first output is based on a first voltage divider output and a first input voltage to the shape memory alloy, and
   the second output is based on a second voltage divider output and a second input voltage to the shape memory alloy.

3. The system of claim 1, wherein the resistance change is a detection that the second resistance differs from the first resistance by a pre-determined threshold.

4. The system of claim 3, wherein the detection that the second resistance is different than the first resistance by a pre-determined threshold comprises a second detection that the second resistance is lower than the first resistance.

5. The system of claim 1, wherein undergoing the partial phase transition causes a contraction of the shape memory alloy.

6. The input device of claim 5, wherein the contraction causes a displacement of a portion of the actuator, the displacement causing a movement of the portion in a planar direction.

7. The system of claim 1, wherein the processing system is further configured to detect, before the current is applied, that a force to an input surface coupled to the actuator exceeds a force threshold, and wherein the current is applied to the shape memory alloy in response to the detection that the force to the input surface exceeds the force threshold.

8. The system of claim 1, wherein the processing system is further configured to:
   detect, before the current is applied by the actuator drive circuitry, a user input, wherein the current is applied in response to the detection of the user input.

9. The system of claim 1, wherein, the actuator drive circuitry comprises a capacitor and a transistor and is further configured to:
   store charge in the capacitor; and
   switch on the transistor to use the charge stored in the capacitor to apply the current to the shape memory alloy.

10. The system of claim 1, wherein:
    the processing system comprises an analog-to-digital converter (ADC), and
    the measurement circuitry comprises a plurality of resistors coupled to an operational amplifier, the operational amplifier being configured to provide the first output and the second output to the ADC.

11. A method, comprising:
    applying a current to a shape memory alloy of an actuator;
    determining a first resistance of the shape memory alloy;
    determining, after measuring the first resistance, a second resistance of the shape memory alloy;
    performing a comparison between the first resistance and the second resistance to detect a resistance change;
    based on the detected resistance change, detecting that the shape memory alloy underwent at least a partial phase transition resulting in actuation of the actuator; and
    ceasing, based on the detected partial phase transition, application of the current to the shape memory alloy.

12. The method of claim 11, wherein measuring the first resistance and measuring the second resistance comprises using a voltage divider with the shape memory alloy being a first voltage divider resistor and a sense resistor being a second voltage divider resistor.

13. The method of claim 11, wherein the detecting the resistance change is a detection that the second resistance is different than the first resistance by a pre-determined threshold.

14. The method of claim 13, wherein the detection that the second resistance is different than the first resistance by a pre-determined threshold comprises a detection that the second resistance is lower than the first resistance.

15. The method of claim 11, wherein undergoing the partial phase transition causes a contraction of the shape memory alloy.

16. The method of claim 11, further comprising:
detecting, before applying the current, a user input, wherein the current is applied in response to the detection of the user input.

17. The method of claim 11, further comprising:
detecting, before applying the current, that a force applied to an input surface coupled to the actuator exceeds a force threshold, wherein the current is applied in response to the detection that the force applied to the input surface coupled to the actuator exceeds the force threshold.

18. The method of claim 11, wherein applying a current to a shape memory alloy of the actuator comprises:
storing charge in a capacitor; and
switching on a transistor to use the charge stored in the capacitor for applying the current to the shape memory alloy.

\* \* \* \* \*